| (12) | United States Patent | (10) Patent No.: | US 8,785,331 B2 |
|---|---|---|---|
| | Cheng | (45) Date of Patent: | Jul. 22, 2014 |

(54) METHOD FOR REPLACING CHLORINE ATOMS ON A FILM LAYER

(75) Inventor: Yang-Ling Cheng, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/639,207

(22) PCT Filed: Jun. 8, 2012

(86) PCT No.: PCT/CN2012/076673
§ 371 (c)(1),
(2), (4) Date: Oct. 4, 2012

(87) PCT Pub. No.: WO2013/174045
PCT Pub. Date: Nov. 28, 2013

(65) Prior Publication Data
US 2013/0316544 A1    Nov. 28, 2013

(30) Foreign Application Priority Data
May 25, 2012   (CN) .......................... 2012 1 0165598

(51) Int. Cl.
*H01L 21/302*    (2006.01)

(52) U.S. Cl.
USPC .............. 438/714; 438/720; 438/766; 216/63

(58) Field of Classification Search
USPC ......... 438/706, 710, 712, 714, 720, 765, 766, 438/737; 216/58, 67, 62, 63
See application file for complete search history.

(56) References Cited

U.S. PATENT DOCUMENTS

| 5,767,021 | A | * | 6/1998 | Imai et al. ..................... 438/719 |
| 6,465,363 | B1 | * | 10/2002 | Kasai ............................ 438/716 |
| 7,871,532 | B2 | * | 1/2011 | Shimizu et al. ................ 216/67 |
| 2003/0129825 | A1 | * | 7/2003 | Yoon ............................ 438/626 |

* cited by examiner

*Primary Examiner* — Lan Vinh
(74) *Attorney, Agent, or Firm* — Kirton McConkie; Evan R. Witt

(57) ABSTRACT

The present invention discloses a method for replacing chlorine atoms on a film layer. More particularly, sufficient replacement ions for replacing the chlorine atoms are formed in a plasma process by reducing a volume ratio of a gas in a gas mixture (i.e. the film layer may be etched with the ions formed by dissociation of the gas) and dissociation of the gas mixture further decreases the etching reaction to the film layer in a process for replacing the chlorine atoms. In comparison to a conventional process by pure oxygen, the present invention can improve the prior art re-etching problem to avoid affecting an electric property of a thin film transistor, also has an advantage of manufacturing time reduction for an increased production yield.

4 Claims, 1 Drawing Sheet

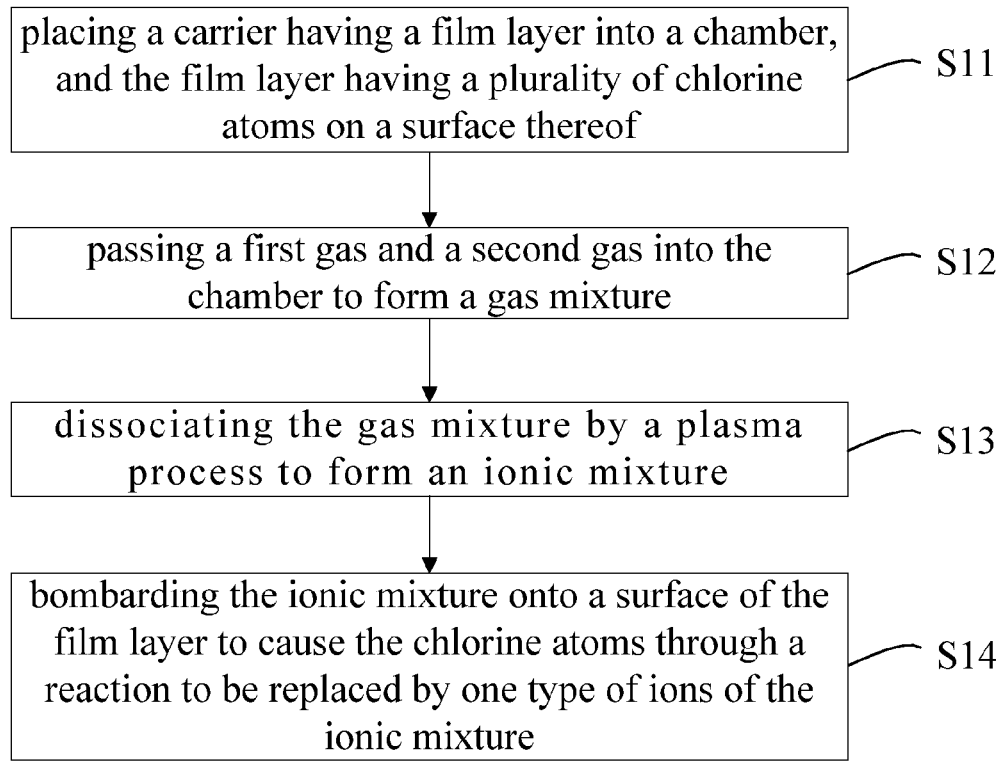

METHOD FOR REPLACING CHLORINE ATOMS ON A FILM LAYER

BACKGROUND OF THE INVENTION

1. Field of the Invention

The present invention relates to a method for corrosion prevention and re-etching prevention after an etching process, and more specifically to a method for replacing chlorine atoms on a film layer.

2. Description of the Prior Art

Etching processes can be classified into two types, a wet etching process and a dry etching process. In the wet etching process, a chemical solution is used and an objective of etching is achieved via a chemical reaction. The dry etching process is generally a plasma etching. The plasma etching has an etching mechanism which is basically through a physical interaction, and the most advantageous of the plasma etching is an anisotropic etching. The anisotropic etching can have an etching direction of an etching reaction which is perpendicular to an acting surface, and therefore can avoid an undercut occurrence, so this is more suitable for etching requirements of high aspect ratio and assemblies of a cavity width smaller than 2-3 μm (micrometers).

A chloride gas (e.g., chlorine) is utilized as an etching media in the plasma etching process, and the plasma energy is used to drive a reaction. In other words, the chloride gas is dissociated by the plasma process to form chloride ions, and the chloride ions are bombarded on a carrier's surface to achieve an etching process. However, there are chlorine residuals remaining on the carrier's surface after the etching process, and when the carrier is exposed to atmospheric humidity, the chlorine residuals on the carrier's surface may react with absorbed water to form hydrogen chloride, which has corrosive character, thereby corroding the carrier's surface.

Therefore, a process is proposed where the plasma process is combined with an oxygen gas and a fluorine-bearing gas to replace the chloride ions. That is, the oxygen gas and the fluorine-bearing gas (e.g., sulfur hexafluoride) are passed after the plasma etching, as well as ionize the oxygen gas and the fluorine-bearing gas through the plasma process to replace chlorine atoms on the carrier's surface, thereby preventing corrosion on the carrier's surface. There are two possible ways to replace the above-mentioned chlorine atoms, a first replacement is achieved by two elements having high affinity, for example, when a carrier is an aluminum substrate, the chlorine atoms on a surface of the aluminum substrate tend to be replaced by oxygen ions; a second replacement is achieved by replacing a low electronegativity element with a high electronegativity element, for example, when a carrier is a copper substrate, the chlorine atoms on a surface of the copper substrate tend to be replaced by fluorine ions. These replacement phenomena are selectively chosen depending on relationships between various types of elements in a reactive environment. In the process of replacing the chlorine atoms through the plasma process, the above-mentioned fluorine-bearing gas, such as the sulfur hexafluoride, has a volume ratio which is generally one-tenth to one-sixth of the oxygen gas. However, the fluorine ions of the sulfur hexafluoride having the above volume ratio will result in an etching reaction again to occur on the carrier's surface after dissociation, thereby affecting an electric property of a thin film transistor. Therefore, the conventional process where a plasma process is combined with pure oxygen to replace chloride ions is still widely used in prior art (i.e., a time period for a replacement reaction is generally 30 sec to 45 sec).

Therefore, there is a need to provide a method for improving the prior art, so as to prevent a re-etching occurrence in a plasma process.

SUMMARY OF THE INVENTION

In view of the above-mentioned, the present invention provides a method for replacing chlorine atoms on a film layer for solving the prior art problem.

An object of the present invention is to provide a method for replacing chlorine atoms on a film layer. A gas (e.g., a fluorine-bearing gas) is reduced in volume ratio in relations to another gas (e.g., an oxygen gas) through a plasma process, so the above two gases (i.e., the fluorine-bearing gas and the oxygen gas) after dissociation have a reduced ionic concentration (e.g., fluorine ions) for an etching reaction with the film layer, and the reduced ionic concentration still has sufficient replacement ions for replacing the chlorine atoms, thereby decreasing an etching reaction to the film layer in a process for replacing the chlorine atoms. The present invention has advantages of, in addition to solving the prior art re-etching problem so as to avoid affecting an electric property of a thin film transistor, reducing manufacturing time in comparison to a conventional process of pure oxygen, thereby increasing production yield.

To achieve the above object, the present invention provides a method for replacing the chlorine atoms on the film layer, and the method comprises the following steps: placing a carrier having the film layer into a chamber, and the film layer having a plurality of chlorine atoms on a surface thereof; passing a first gas and a second gas into the chamber to form a gas mixture, in which a volume ratio of the second gas is less than one-tenth of the volume ratio of the first gas; dissociating the gas mixture through a plasma process to form an ionic mixture; and bombarding the ionic mixture onto a surface of the film layer, causing the chlorine atoms through a reaction to be replaced by one type of ions of the ionic mixture.

In one exemplary embodiment of the present invention, a volume ratio of the second gas is more than one-twentieth of the volume ratio of the first gas.

In one exemplary embodiment of the present invention, the first gas is an oxygen gas.

In one exemplary embodiment of the present invention, an electronegativity of an ion formed by dissociating the second gas is greater than an electronegativity of a chloride ion.

In one exemplary embodiment of the present invention, the second gas is a fluorine-bearing gas.

In one exemplary embodiment of the present invention, the fluorine-bearing gas is sulfur hexafluoride or carbon tetrafluoride.

In one exemplary embodiment of the present invention, the film layer comprises a metal layer, a semiconductor layer, or an insulative layer.

In one exemplary embodiment of the present invention, a power condition of the plasma process is between 1250 watt to 1750 watt.

In one exemplary embodiment of the present invention, a pressure condition of the plasma process is between 60 mTorr (milliTorr) to 100 mTorr.

In one exemplary embodiment of the present invention, a processing time of the plasma process is between 10 sec to 15 sec.

The present invention has obvious advantages and beneficial effects in comparison to the prior art. The method for replacing the chlorine atoms on the film layer of the present invention according to the above technical scheme has at least the following advantages and beneficial effects. The method for replacing the chlorine atoms on the film layer of the present invention is achieved by reducing the volume ratio of the gas (e.g., the fluorine-bearing gas) relative to another gas (e.g., the oxygen gas) in the plasma process, the ionic concentration for which to have an etching reaction with the film layer (e.g., fluorine ions) is reduced after the above-mentioned two gases (i.e., the fluorine-bearing gas and the oxygen gas) are dissociated, and the reduced ionic concentration still has sufficient replacement ions for replacing the chlorine atoms, thereby decreasing the etching reaction to the film layer so as to avoid affecting the electric property of the thin film transistor in the process for replacing the chlorine atoms. The present invention also has reduced manufacturing time in comparison to the conventional process of pure oxygen, thereby increasing production yield.

BRIEF DESCRIPTION OF THE DRAWINGS

FIG. 1 is a flow chart of a method according to an embodiment of the present invention for replacing chlorine atoms on a film layer.

DETAILED DESCRIPTION OF THE PREFERRED EMBODIMENTS

Various preferred embodiments are now described with reference to the accompanying drawings. In the following description, for purposes of explanation, numerous specific details are set forth in order to provide a thorough understanding of a method for replacing chlorine atoms on a film layer, and its specific embodiment, structure, feature and functions.

Please refer to FIG. 1, FIG. 1 is a flow chart of a method according to an embodiment of the present invention for replacing chlorine atoms on a film layer, and the method includes the following steps S11-S14.

In step S11, a carrier having the film layer is placed into a chamber, and the film layer has a plurality of chlorine atoms on a surface thereof. The carrier having the film layer is etched by a plasma etching as mentioned in the prior art before proceeding step S11. Amongst, the film layer can be a metal layer, a semiconductor layer, or an insulative layer.

In step S12, a first gas and a second gas are passed into the chamber to form a gas mixture, in which a volume ratio of the second gas is less than one-tenth of the volume ratio of the first gas. The reason is that the film layer will be etched by ions formed by dissociating the second gas if the volume ratio of the second gas is more than one-tenth of the volume ratio of the first gas. The volume ratio of the second gas preferably is one-twentieth to one-tenth of the volume ratio of the first gas. In other words, the volume ratio of the second gas is more than one-twentieth and less than one-tenth of the volume ratio of the first gas. The above-mentioned volume ratio of the second gas leads to a sufficient concentration of the replacement ions which are generated by the dissociating process. The first gas is an oxygen gas, and the second gas can be a fluorine-bearing gas, such as sulfur hexafluoride ($SF_6$), carbon tetrafluoride ($CF_4$), and the like. However, the second gas can also be another gas which satisfies the following condition: an electronegativity of an ion formed by dissociating the other gas has to be greater than an electronegativity of a chloride ion. Then, a replacement reaction (corresponding to the second replacement in the prior art) can be performed by electronegativity differences in step S14.

In step S13, the gas mixture is dissociated by a plasma process to form an ionic mixture. The ionic mixture such as that of the gas mixture is dissociated by the plasma process to form a mixture made of oxygen ions and fluorine ions when the gas mixture is made of the oxygen gas and the fluorine-bearing gas. The plasma process has a power condition between 1250 watt to 1750 watt and a pressure condition between 60 mTorr to 100 mTorr, while a preferred processing time of the plasma process is between 10 sec to 15 sec.

In step S14, the ionic mixture is bombarded on a surface of the film layer, and as a result, the chlorine atoms are replaced by one type of ions of the ionic mixture through a reaction. Step 13 and the above bombardment are integrated as one process, so that Step 13 and the bombardment process occur simultaneously. There are two possible replacements as mentioned in the description of the background which include the first replacement and the second replacement (the examples of replacements can be referred to in the above-mentioned background of the invention, and therefore will not be discussed here).

As above-mentioned, the method for replacing the chlorine atoms on the film layer of the present invention is by reducing the volume ratio of the gas (e.g., the fluorine-bearing gas) relative to another gas (e.g., the oxygen gas) in the plasma process, the concentration of the ions (e.g., the fluorine ions), with which the etching reaction of the film layer will occur, is reduced after the above-mentioned two gases (i.e., the fluorine-bearing gas and the oxygen gas) are dissociated, there will still be sufficient quantity of the replacement ions for replacing the chlorine atoms even when the ion concentration is reduced, thereby decreasing the etching reaction to the film layer in a process for replacing the chlorine atoms. Furthermore, another gas (i.e., the oxygen gas) is dissociated by the plasma process to form ions (i.e., the oxygen ions). It is not required to reduce the volume ratio of another gas because the ions will not cause an etching reaction. The present invention can improve the prior art re-etching problem to avoid affecting an electric property of a thin film transistor, as well as reducing manufacturing time in comparison to a conventional process by pure oxygen, thereby increasing production yield also decreasing production costs.

The above description of the invention is intended to be illustrative and not limiting. Various changes or modifications in the embodiments described may occur to those skilled in the art. These can be achieved without departing from the spirit or scope of the invention.

What is claimed is:

1. A method for replacing chlorine atoms on a film layer comprising the steps of:
    placing a carrier having the film layer into a chamber, the film layer having a plurality of chlorine atoms on a surface thereof, wherein the film layer comprises a metal layer, a semiconductor layer and an insulative layer;
    passing a first gas and a second gas into the chamber to form a gas mixture, a volume ratio of the second gas being less than one-tenth of the volume ratio of the first gas, wherein the first gas is an oxygen gas, and an electronegativity of an ion formed by dissociating the second gas is greater than an electronegativity of a chloride ion;
    dissociating the gas mixture by a plasma process to form an ionic mixture, wherein a power condition of the plasma process is 1250 watt to 1750 watt, a pressure condition of the plasma process is 60 mTorr (milliTorr) to 100 mTorr, and a processing time of the plasma process is 10 sec to 15 sec; and bombarding the ionic mixture onto a surface of the film layer, causing the chlorine atoms through a reaction to be replaced by one type of ions of the ionic mixture.

2. The method of claim 1, wherein a volume ratio of the second gas is more than one-twentieth of the volume ratio of the first gas.

3. The method of claim 1, wherein the second gas is a fluorine-bearing gas.

4. The method of claim 3, wherein the fluorine-bearing gas is sulfur hexafluoride or carbon tetrafluoride.

* * * * *